United States Patent
Kim

(10) Patent No.: US 7,705,651 B2
(45) Date of Patent: Apr. 27, 2010

(54) DELAY CIRCUIT OF SEMICONDUCTOR MEMORY APPARATUS

(75) Inventor: Seung Bong Kim, Ichon (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 12/013,892

(22) Filed: Jan. 14, 2008

(65) Prior Publication Data

US 2009/0039932 A1    Feb. 12, 2009

(30) Foreign Application Priority Data

Aug. 10, 2007    (KR) .................. 10-2007-0080624

(51) Int. Cl.
*H03H 11/26* (2006.01)
(52) U.S. Cl. ........................ 327/276; 327/31
(58) Field of Classification Search ................ 327/261, 327/263, 276, 277, 284, 31, 37, 161
See application file for complete search history.

(56) References Cited

U.S. PATENT DOCUMENTS

| | | | |
|---|---|---|---|
| 4,637,018 A * | 1/1987 | Flora et al. .................. 714/700 |
| 4,737,670 A * | 4/1988 | Chan .......................... 327/278 |
| 5,128,554 A * | 7/1992 | Hoshizaki .................... 327/147 |
| 6,836,165 B2 | 12/2004 | Goto et al. |
| 6,885,230 B2 * | 4/2005 | Mehalel ...................... 327/261 |
| 6,982,923 B2 | 1/2006 | Ootsuki |
| 7,187,224 B2 * | 3/2007 | Mehalel ...................... 327/261 |
| 7,221,201 B2 * | 5/2007 | Lin et al. .................... 327/158 |
| 7,612,587 B2 * | 11/2009 | Cheng .......................... 327/99 |
| 2004/0179640 A1 * | 9/2004 | Jacob et al. .................. 375/376 |
| 2005/0254307 A1 | 11/2005 | Dietrich et al. |

FOREIGN PATENT DOCUMENTS

KR    1020010006635 A    1/2001

* cited by examiner

*Primary Examiner*—Lincoln Donovan
*Assistant Examiner*—William Hernandez
(74) *Attorney, Agent, or Firm*—Baker & McKenzie LLP

(57) ABSTRACT

A delay circuit of a semiconductor memory apparatus can include a clock period sensing unit for generating a sensing signal in response to a clock frequency, and a selective delay unit for delaying an input signal for a delay time and then output the input signal as an output signal, wherein the delay time can be one selected from a plurality of delay times according to the sensing signal. The delay time can be selectively determined according to a clock frequency used in a semiconductor memory apparatus.

18 Claims, 3 Drawing Sheets

DELAY CIRCUIT OF SEMICONDUCTOR MEMORY APPARATUS

CROSS-REFERENCES TO RELATED APPLICATION

This application claims the benefit under 35 U.S.C. 119(a) of Korean application number 10-2007-0080624, filed on 10 Aug., 2007 in the Korean Intellectual Property Office, the disclosure of which is incorporated herein by reference in its entirety as if set forth in full.

BACKGROUND

1. Technical Field

The disclosure herein relates to a semiconductor memory apparatus and, more particularly, to a delay circuit for delaying an input signal in a semiconductor memory apparatus.

2. Related Art

Conventional semiconductor memory apparatus include a delay circuit for delaying an input signal. The delay circuit used in a conventional semiconductor memory apparatus delays the input signal for a certain delay time regardless of a clock period.

Meanwhile, clock frequencies used for high speed semiconductor memory apparatus are becoming higher and higher. Still, low clock frequency semiconductor memory apparatus are still being used as occasion demands. As mentioned, the delay circuit used in high clock frequency and low clock frequency semiconductor memory apparatus delays the input signal for a specific delay period associated with each device regardless of the clock frequency. Therefore, the delay time of the delay circuit should be adjusted according to a clock frequency type of the semiconductor memory apparatus.

SUMMARY

A delay circuit for delaying an input signal in a semiconductor memory apparatus is disclosed herein.

According to one aspect, a delay circuit of a semiconductor memory apparatus can comprise a clock period sensing unit configured to generate a sensing signal in response to a clock frequency, and a selective delay unit configured to delay an input signal for a delay time and transmit the input signal as an output signal, wherein the delay time can be one selected from a plurality of delay times according to the sensing signal.

According to another aspect, a delay circuit of a semiconductor memory apparatus can comprise a clock period sensing unit configured to compare a reference time with one period of a clock to generate a sensing signal, and a selective delay unit configured to delay an input signal for a delay time which can be selected according to the sensing signal and outputting the input signal as an output signal.

These and other features, aspects, and embodiments are described below in the section entitled "Detailed Description."

BRIEF DESCRIPTION OF THE DRAWINGS

Features, aspects, and embodiments are described in conjunction with the attached drawings, in which.

DETAILED DESCRIPTION

Figure 1:
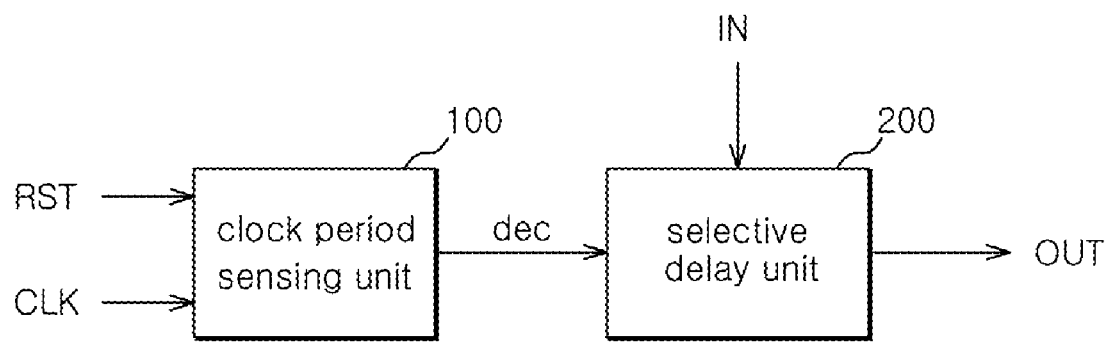
FIG. 1 is a block diagram of a delay circuit in a semiconductor memory apparatus according to one embodiment.

FIG. 1 is a block diagram of a delay circuit 101 in a semiconductor memory apparatus according to one embodiment. Referring to FIG. 1, the delay circuit 101 can include a clock period sensing unit 100 and a selective delay unit 200.

The clock period sensing unit 100 can be initialized when a reset signal (RST) is activated. After the reset signal (RST) is deactivated, the clock period sensing unit 100 can compare the time period of a clock (CLK) with a reference time to generate a sensing signal (dec). That is, the clock period sensing unit 100 can generate the sensing signal (dec) in response to a clock frequency, which is a function of the clock period and the reference time.

The selective delay unit 200 can delay an input signal (IN) for a selected delay time and output the input signal (IN) as an output signal (OUT) in response to the sensing signal (dec).

Figure 2:
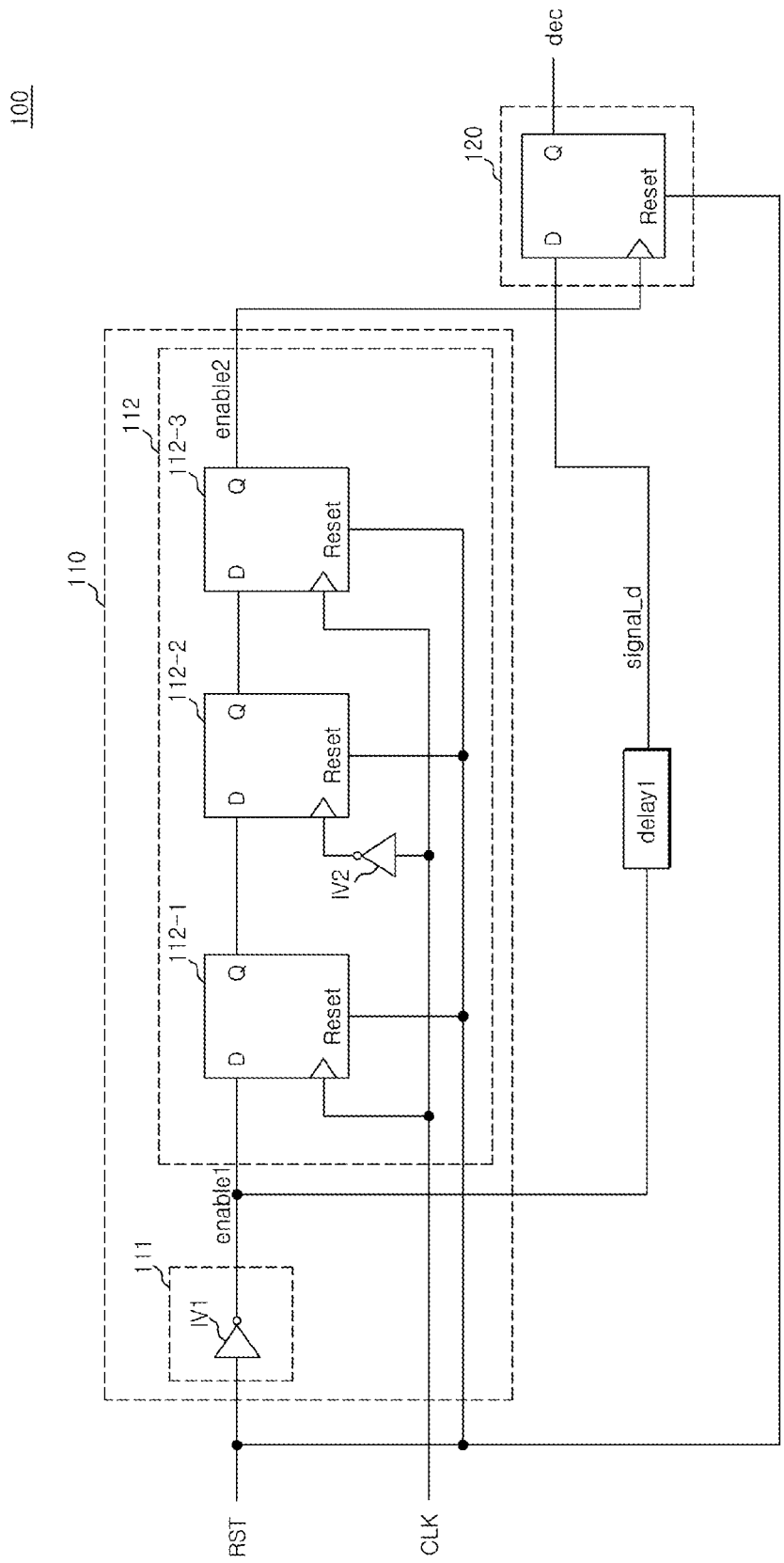
FIG. 2 is a circuit diagram of a clock period sensing unit that can be included in the circuit illustrated in FIG. 1.

FIG. 2 is a circuit diagram of a clock period sensing unit that can be included in the circuit illustrated in FIG. 1. As shown in FIG. 2, the clock period sensing unit 100 can include an enable signal generating unit 110, a first delayer delay1 and a sensing signal generating unit 120.

The enable signal generating unit 110 can be configured to generate a first enable signal (enable1), which is initialized when the reset signal (RST) is activated and is activated when the reset signal (RST) is deactivated. Also, the enable signal generating unit 110 can generate a second enable signal (enable2), which can be activated when the first enable signal (enable1) is activated and one period of the clock (CLK) elapses.

The enable signal generating unit 110 can include a first signal generating unit 111 and a second signal generating unit 112. The first signal generating unit 111 can include a first inverter IV1 and can generate the first enable signal (enable1), which can be activated in a high level when the reset signal (RST) is deactivated at a low level. The second signal generating unit 112 can generate the second enable signal (enable2), which can be initialized when the reset signal (RST) is activated at a high level, and is activated at a high level when the reset signal (RST) is deactivated at a low level (that is, when the first enable signal (enable1) is activated) and one period of the clock (CLK) elapses.

The second signal generating unit 112 can include first to third flip-flops 112-1, 112-2 and 112-3 and a second inverter IV2. The first flip-flop 112-1 can receive the first enable signal (enable1) and the clock (CLK). When the clock (CLK) is in a high level, the first flip-flop 112-1 can output the first enable signal (enable1) as an output signal. The second inverter IV2 can invert the clock (CLK) and the inverted clock can then be sent to the second flip-flop 112-2. The second flip-flop 112-2 can receive an output signal of the first flip-flop 112-1 and an output signal of the second inverter IV2. When the output signal of the second inverter IV2 is at a high level, that is, when the clock (CLK) is at a low level, the second flip-flop 112-2 can output the output signal of the first flip-flop 112-1 as an output signal. The third flip-flop 112-3 can receive an output signal of the second flip-flop 112-2 and the clock (CLK). When the clock (CLK) is at a high level, the third flip-flop 112-3 can output the output signal of the second flip-flop 112-2 as an output signal.

At this time, when the reset signal (RST) is activated in a high level, each of the first to third flip-flops 112-1, 112-2 and 112-3 can be initialized and can output a low level output signal. The first delayer delay1 can have a delay time that can be the same as the reference time. The first delayer delay1 can delay the first enable signal (enable1) for the reference time to output a delay signal (signal_d).

When the second enable signal (enable2) is activated in a high level, the sensing signal generating unit 120 can output a voltage level of the delay signal (signal_d) as the sensing signal (dec). For example, when the second enable signal (enable2) is activated at a high level, the sensing signal generating unit 120 can output the sensing signal (dec) which can be activated at a high level when the delay signal (signal_d) is at a high level. Meanwhile, when the second enable signal (enable2) is activated at a high level, the sensing signal generating unit 120 can output the sensing signal (dec), which is deactivated at a low level when the delay signal (signal_d) is at a low level. Also, when the reset signal (RST) is activated, the sensing signal (dec) can be initialized, and deactivated at a low level.

The sensing signal generating unit 120 can include a fourth flip-flop 120. When the reset signal (RST) is activated at a high level, the sensing signal (dec) can be deactivated at a low level. That is, the fourth flip-flop 120 can be initialized by the reset signal (RST). When the second enable signal (enable2) is at a high level, the fourth flip-flop 120 can output the sensing signal (dec) based on the voltage level of the delay signal (signal_d).

Figure 3:
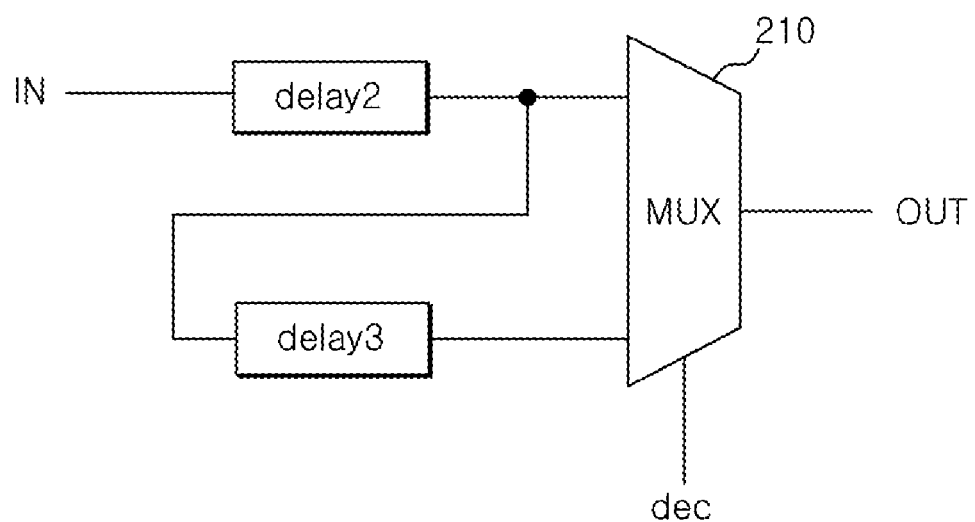
FIG. 3 is a circuit diagram of a selective delay unit that can be included in the circuit illustrated in FIG. 1.

FIG. 3 is a circuit diagram of a selective delay unit 200 that can be included in the circuit illustrated in FIG. 1. As shown in FIG. 3, the selective delay unit 200 can include second and third delayers delay2 and delay3 and a multiplexer 210.

The second delayer delay2 can receive the input signal (IN) and the third delayer delay3 can receive an output signal of the second delayer delay2.

The multiplexer 210 can selectively output one of the output signals of the second and third delayers delay2 and delay3 in response to the sensing signal (dec). For example, when the sensing signal (dec) is deactivated at a low level, the input signal (IN) can be delayed as much as the delay time of the second delayer delay2 to be output as the output signal (OUT). Meanwhile, when the sensing signal (dec) is activated at a high level, the input signal (IN) can be delayed as much as the delay times of the second and third delayers delay2 and delay3 to be output as the output signal (OUT).

The operation of the delay circuit of a semiconductor memory apparatus will be described referring to FIGS. 2 and 3.

Referring to FIG. 2, when the reset signal (RST) is activated, the first to fourth flip-flops 112-1, 112-2, 112-3 and 120 can be initialized. That is, when the reset signal (RST) is activated at a high level, each of the first to fourth flip-flops 112-1, 112-2, 112-3 and 120 can output a low level signal. When the reset signal (RST) is deactivated at a low level, the first signal generating unit 111 can generate the first enable signal (enable1), which can be activated in a high level.

The first enable signal (enable1), which can be activated at a high level, can be input to the first flip-flop 112-1. When the clock (CLK) is at a high level, the first flip-flop 112-1 can output a high level signal to the second flip-flop 112-2. When the clock (CLK) is at a low level, the second flip-flop 112-2 can produce the output signal by transferring the high level signal from the first flip-flop 112-1. When the clock (CLK) is at a high level, the third flip-flop 112-3 can produce the output signal by transferring the high level signal from the second flip-flop 112-2.

The first delayer delay1 can delay the first enable signal (enable1), which is activated at a high level, to output the delay signal (signal_d). At this time, the delay time of the first delayer delay1 can be the same as the reference time. That is, the first delayer delay1 can receive the first enable signal (enable1), which can be activated at a high level, and output the delay signal (signal_d) of a high level with the lapse of the reference time.

When the second enable signal (enable2) is at a high level, the sensing signal generating unit 120, namely, the fourth flip-flop 120 can determine the level of the sensing signal (dec) according to the level of the delay signal (signal_d). For example, when the second enable signal (enable2) is at a high level, the sensing signal generating unit 120 can generate the sensing signal (dec), which is deactivated at a low level if the delay signal (signal_d) is at a low level. Meanwhile, when the second enable signal (enable2) is at a high level, the sensing signal generating unit 120 can generate the sensing signal (dec), which can be activated at a high level if the delay signal (signal_d) is at a high level.

Referring to FIG. 3, the selective delay unit 200 can delay the input signal (IN) as much as a delay time that is selected based on whether the sensing signal (dec) is activated or not and output the output signal (OUT). For example, when the sensing signal (dec) is deactivated at a low level, the input signal (IN) can pass through the second delayer delay2 to be output as the output signal (OUT). Meanwhile, when the sensing signal (dec) is activated at a high level, the input signal (IN) passes through the second and third delayers delay2 and delay3 to be output as the output signal (OUT).

The delay circuit of a semiconductor memory apparatus, according to one embodiment, can compare the delay time of the first delayer delay1 with one period of the clock (CLK) to generate the sensing signal (dec). For example, if the one period of the clock (CLK) is shorter than the delay time of the first delayer delay1, the sensing signal (dec) can be deactivated at a low level. Meanwhile, if the one period of the clock (CLK) is longer than the delay time of the first delayer delay1, the sensing signal (dec) can be activated at a high level.

The sensing signal (dec) can be an input to the selective delay unit 200. When the sensing signal (dec) is deactivated at a low level, the input signal (IN) can pass through only the second delayer delay2 to be output as the output signal (OUT). Meanwhile, when the sensing signal (dec) is activated at a high level, the input signal (IN) can pass through the second and third delayers delay2 and delay3 to be output as the output signal (OUT).

At a fast clock frequency, the delay circuit, according to one embodiment, can have a delay time that can be shorter than that used for a slow clock frequency, and at the slow clock frequency, the delay circuit can have a delay time that can be longer than that used for the fast clock frequency. However, to the contrary, it can be possible to control the delay circuit to have a delay time that is longer than that used for the slow clock frequency in case that the clock frequency is fast or to have a delay time that is shorter than that used for the fast clock frequency in case that the clock frequency is slow.

Accordingly, since the delay circuit according to the embodiments described herein can automatically control a delay time according to the frequency of a clock, there is no need to control the delay time whenever the semiconductor memory apparatus is designed with a different frequency.

While certain embodiments have been described above, it will be understood that the embodiments described are by way of example only. Accordingly, the apparatus and methods described herein should not be limited based on the described embodiments. Rather, the apparatus and methods described herein should only be limited in light of the claims that follow when taken in conjunction with the above description and accompanying drawings.

What is claimed is:

1. A delay circuit of a semiconductor memory apparatus, comprising:
   a clock period sensing unit for sensing frequency of an input clock to generate a sensing signal in response to sensed frequency of the input clock; and
   a selective delay unit for delaying an input signal for a delay time and outputting the input signal as an output signal,
   wherein the delay time is one selected from a plurality of delay times according to the sensing signal,
   wherein the clock period sensing unit is initialized in response to a reset signal, and
   wherein the clock period sensing unit is initialized when the reset signal is activated and generates the sensing signal after one period of the clock from inactivating the reset signal.

2. The delay circuit of claim 1, wherein the clock period sensing unit includes:
   an enable signal generating unit for generating a first enable signal which is initialized when the reset signal is activated and is activated when the reset signal is deactivated and generating a second enable signal which is activated after one period of the clock from an activation of the first enable signal;
   a delayer for delaying the first enable signal to generate a delay signal; and
   a sensing signal generating unit, which is initialized when the reset signal is activated, for generating the sensing signal in response to the delay signal and the second enable signal.

3. The delay circuit of claim 2, wherein the enable signal generating unit generates the first enable signal which is initialized when the reset signal is activated and is activated when the reset signal is deactivated, and enables the second enable signal when the clock is transited to a high level twice after the first enable signal is activated.

4. The delay circuit of claim 3, wherein the enable signal generating unit includes:
   a first signal generating unit for inverting the reset signal to generate the first enable signal; and
   a second signal generating unit for generating the second enable signal when the first enable signal is activated and the clock is transited to a high level twice.

5. The delay circuit of claim 4, wherein the second signal generating unit includes first to third flip-flops which are in series connected to each other and transfers the first enable signal to output the second enable signal in response to the clock and wherein the first to third flip-flops are initialized in response to the reset signal.

6. The delay circuit of claim 5, wherein the first flip-flop transfers the first enable signal to produce an output signal when the clock is in a high level, the second flip-flop transfers the output signal of the first flip-flop to produce an output signal when the clock is in a low level, and the third flip-flop transfers the output signal of the second flip-flop to produce the second enable signal when the clock is in a high level.

7. The delay circuit of claim 2, wherein the sensing signal generating unit is initialized when the reset signal is activated and outputs the delay signal as the sensing signal when the second enable signal is activated.

8. The delay circuit of claim 7, wherein the sensing signal generating unit includes a flip-flop which is initialized by the reset signal and outputs the delay signal as the sensing signal when the second enable signal is activated and, wherein the flip-flop is initialized in response to the reset signal.

9. The delay circuit of claim 1, wherein the selective delay unit is configured to output the output signal by delaying the input signal for a delay time which is shorter than that at an activation of the sensing signal if the sensing signal is deactivated, and output the output signal by delaying the input signal for a delay time which is longer than that at an inactivation of the sensing signal if the sensing signal is activated.

10. The delay circuit of claim 9, wherein the selective delay unit includes:
    a first delayer for delaying and outputting the input signal;
    a second delayer for delaying and outputting an output signal of the first delayer; and
    a multiplexer for outputting the output signal of the first delayer or an output signal of the second delayer in response to the sensing signal.

11. A delay circuit of a semiconductor memory apparatus, comprising:
    a clock period sensing unit for receiving an input clock and comparing a reference time with one period of a clock to generate a sensing signal; and
    a selective delay unit for delaying an input signal for a delay time which is selected according to the sensing signal and outputting the input signal as an output signal,
    wherein the clock period sensing unit is initialized when the reset signal is activated and compares a time when the clock is transited to a high level twice after the reset signal is deactivated with the reference time to generate the sensing signal.

12. The delay circuit of claim 11, wherein the clock period sensing unit activates the sensing signal if one period of the clock is longer than the reference time and deactivates the sensing signal if one period of the clock is shorter than the reference time.

13. The delay circuit of claim 12, wherein the clock period sensing unit includes:
    an enable signal generating unit for generating a first enable signal which is activated when the reset signal is deactivated and outputting the first enable signal as a second enable signal when the clock is transited to a high level twice;
    a delayer for delaying the first enable signal for the reference time to generate a delay signal; and
    a sensing signal generating unit for outputting a level of the delay signal as the sensing signal when the second enable signal is activated.

14. The delay circuit of claim 13, wherein the enable signal generating unit includes:
    a first signal generating unit for generating the first enable signal which is activated when the reset signal is deactivated; and
    a second signal generating unit for outputting the second enable signal by delaying the first enable signal from an inactivation of the reset signal until the clock is transited to a high level twice.

15. The delay circuit of claim 14, wherein the second signal generating unit includes first to third flip-flops which are initialized when the reset signal is activated and operate in response to the clock and wherein the first to third flip-flops are in series connected.

16. The delay circuit of claim 15, wherein the first flip-flop outputs the first enable signal as an output signal when the clock is in a high level, the second flip-flop outputs the output signal of the first flip-flop as an output signal when the clock is in a low level, and the third flip-flop outputs the output signal of the second flip-flop as the second enable signal when the clock is in a high level.

17. The delay circuit of claim 11, wherein the selective delay unit outputs the output signal by delaying the input signal for a delay time which is shorter than that at an activation of the sensing signal if the sensing signal is deactivated and outputs the output signal by delaying the input signal for a delay time which is longer than an inactivation of the sensing signal if the sensing signal is activated.

18. The delay circuit of claim 17, wherein the selective delay unit includes:

a first delayer for delaying and outputting the input signal;

a second delayer for delaying and outputting an output signal of the first delayer; and a multiplexer for outputting the output signal of the first delayer or an output signal of the second delayer in response to the sensing signal.

\* \* \* \* \*